(12) United States Patent
Chang et al.

(10) Patent No.: US 6,326,310 B1
(45) Date of Patent: *Dec. 4, 2001

(54) METHOD AND SYSTEM FOR PROVIDING SHALLOW TRENCH PROFILE SHAPING THROUGH SPACER AND ETCHING

(75) Inventors: Mark S. Chang, Los Altos; Yowjuang W. Liu, San Jose, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/992,623

(22) Filed: Dec. 17, 1997

(51) Int. Cl.[7] .................................. H01L 21/311
(52) U.S. Cl. .................. 438/694; 438/700; 438/701; 438/702
(58) Field of Search .................. 438/700, 701, 438/702, 694

(56) References Cited

U.S. PATENT DOCUMENTS

| | | | |
|---|---|---|---|
| 5,308,784 | * 5/1994 | Kim et al. | 437/67 |
| 5,372,968 | * 12/1994 | Lur et al. | 437/67 |
| 5,620,930 | * 4/1997 | Hey et al. | 438/421 |
| 5,888,880 | * 3/1999 | Gardner et al. | 438/424 |

\* cited by examiner

*Primary Examiner*—Robert Kunemund
*Assistant Examiner*—Vanessa Perez-Ramos
(74) *Attorney, Agent, or Firm*—Sawyer Law Group LLP

(57) ABSTRACT

A system and method for providing a trench in a material using semiconductor processing is disclosed. In one aspect, the method and system include (a) providing a spacer, (b) etching the material, and (c) repeating steps (a) and (b) a sufficient number of times to achieve a desired profile for the trench. The spacer is insensitive to an etch of the material. The material is exposed adjacent to the spacer. In another aspect, the method and system include (a) providing a spacer, (b) etching the material, (c) stripping the spacer, and (d) repeating steps (a) through (c) until a desired profile for the trench is achieved. Each time steps (a) through (c) are repeated via step (d), a thinner spacer is provided. In addition, the spacer is insensitive to an etch of the material. The material is exposed adjacent to the spacer.

9 Claims, 4 Drawing Sheets

METHOD AND SYSTEM FOR PROVIDING SHALLOW TRENCH PROFILE SHAPING THROUGH SPACER AND ETCHING

FIELD OF THE INVENTION

The present invention relates to semiconductor processing and more particularly to a method and system for shaping trenches to a desired profile.

BACKGROUND OF THE INVENTION

As dimensions of semiconductor devices shrink, isolation techniques have had to move from conventional local oxidation of silicon ("LOCOS") isolation techniques to silicon trench isolation. In fabricating an isolation structure for silicon trench isolation, a trench is created in a silicon substrate. The trench is then filled with an oxide to provide isolation.

In order to create the trench, a thin layer of oxide and a thicker layer of silicon nitride are grown and deposited, respectively, on the semiconductor substrate. Photoresist is then used to pattern the semiconductor, exposing areas in which the trench will be formed. The silicon nitride and oxide layers are then etched. The underlying semiconductor is then etched and the photoresist is stripped. In some conventional systems, an additional layer oxide is grown on the surface of the trench.

Although the conventional process discussed above is capable of providing a trench, the profile of the trench cannot be precisely controlled and tuned. For example, the conventional process results in corners at the base and at the top of the trench being relatively sharp. Consequently, device performance is adversely affected. In addition, the walls of the trench formed using a conventional process are relatively vertical. For narrow trenches, this vertical profile also makes filling the trench more difficult because it is more difficult for subsequently deposited materials to fill the trench. In addition, it may not be possible to form narrow shallow trenches which would also be wide enough to isolate structures on the semiconductor, particularly from charges which tunnel through the oxide filler within the trench. Moreover, the conventional process results in corners at the upper portion of the trench being relatively sharp and, therefore, high stress points. During a subsequent oxidation cycle, these corners can inhibit the formation of a good quality oxide. The lack of a good quality gate oxide adversely affects the device performance and reliability.

Accordingly, what is needed is a system and method for more accurately controlling the profile of a trench. In particular, control over the shape of the corners and incline of the trench walls is desirable. The present invention addresses such a need.

SUMMARY OF THE INVENTION

The present invention provides a method and system for providing a trench in a material using semiconductor processing. In one aspect, the method and system comprise (a) providing a spacer, (b) etching the material, and (c) repeating steps (a) and (b) a sufficient number of times to achieve a desired profile for the trench. The spacer is insensitive to an etch of the material. The material is exposed adjacent to the spacer. In another aspect, the method and system comprise (a) providing a spacer, (b) etching the material, (c) stripping the spacer, and (d) repeating steps (a) through (c) until a desired profile for the trench is achieved. In addition, the spacer is insensitive to an etch of the material. The material is exposed adjacent to the spacer. Each time steps (a) through (c) are repeated via step (d), a thinner spacer is provided.

According to the system and method disclosed herein, the present invention allows the profile of a trench to be easily and more accurately tailored.

DETAILED DESCRIPTION OF THE INVENTION

The present invention relates to an improvement in formation of trenches using semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
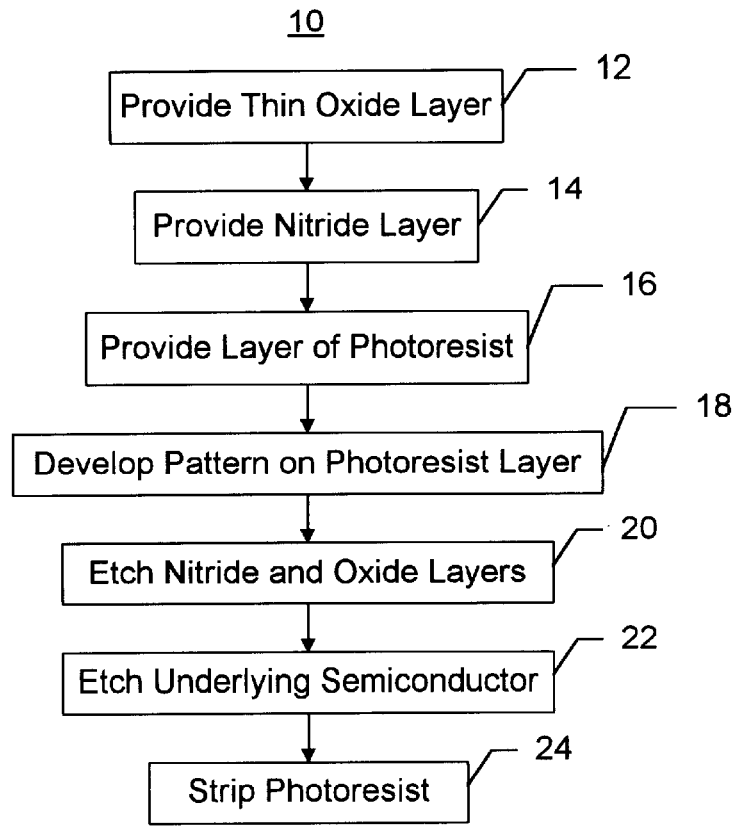
FIG. 1 is a flow chart of a conventional method for forming a trench in a semiconductor.

FIG. 1 is a flow chart of a conventional method 10 for providing a trench in a semiconductor. First, a thin layer of oxide is provided on a semiconductor substrate via step 12. A thicker nitride layer is then provided via step 14. A layer of photoresist is then deposited via step 16. A pattern is then developed in the photoresist via step 18. The pattern exposes the area of nitride above the portion of the semiconductor substrate in which the trench will be formed. The nitride and oxide layers are etched via step 20. The area of the semiconductor in which the trench will be grown is thereby exposed. The underlying semiconductor is then etched via step 22. In addition, the photoresist is stripped via step 24. Although not shown, in some conventional systems, an additional layer oxide is grown on the surface of the trench.

Figure 2:
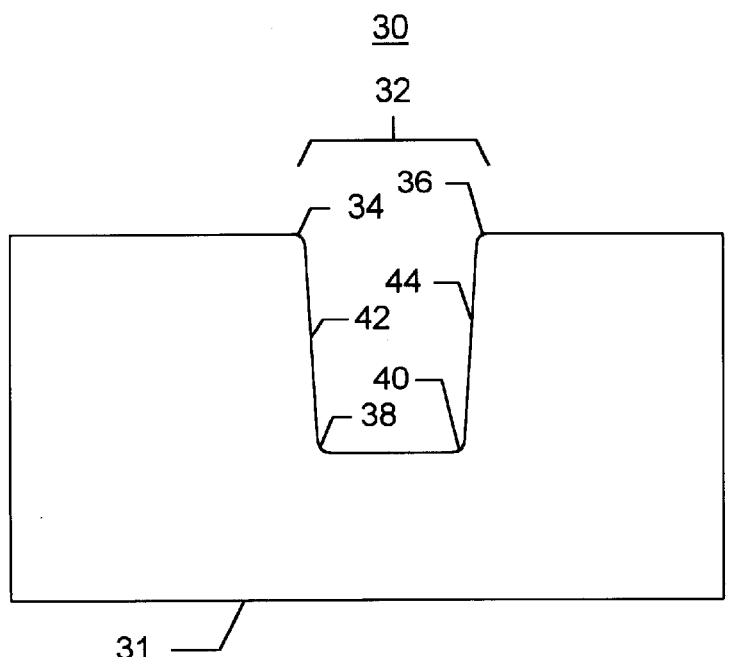
FIG. 2 is a is a block diagram depicting a conventional semiconductor trench.

FIG. 2 depicts a system 30 formed in accordance with the conventional method 10. The system 30 includes a semiconductor 31 in which a trench 32 is formed. The trench 32 includes upper corners 34 and 36 and bottom corners 38 and 40. The trench 32 also includes trench walls 42 and 44.

Although the conventional method 10 is capable of providing a trench, one of ordinary skill in the art will readily recognize that the profile of the trench 32 cannot be precisely controlled. For example, the conventional process results in the upper corners 34 and 36 being only slightly rounded due to the processing. The chemistry of the semiconductor etch partially controls the shape of the bottom corners 38 and 40. As a result of the semiconductor etch performed in step 22, the bottom corners 38 and 40 are only slightly rounded. Moreover, the method 10 results in the trench walls 42 and 44 being nearly vertical.

The features of the trench 32 resulting from the conventional method 10 have several drawbacks. Because the upper corners 34 and 36 and the bottom corners 38 and 40 are only slightly rounded, coverage of a material deposited in the trench is adversely affected. This phenomenon may result in reduced isolation. Because the walls 42 and 44 of the trench formed using the conventional method 10 are relatively vertical, the trench 32 is relatively narrow. This narrow profile also makes filling the trench 32 more difficult because it is more difficult for subsequently deposited materials to cover the trench walls. In addition, it may not be possible to form shallow trenches which are wide enough to isolate structures on the semiconductor. The upper corners 34 and 36 are high stress points. During a subsequent oxidation cycle, these corners can inhibit the formation of a good quality oxide. The lack of a good quality gate oxide adversely affects the device performance and reliability.

The present invention provides for a method and system for providing a trench having a controllable profile using semiconductor processing. The method and system control the profile of the trench using spacers which are deposited during trench formation. The profile of the trench can be varied depending upon the number and width of spacers deposited. Thus, the spacers aid in controlling the trench profile including the corners and walls of the trench.

The present invention will be described in terms of a trench provided in a semiconductor substrate. However, one of ordinary skill in the art will readily recognize that this method and system will operate effectively for other types of substrate materials or trenches formed in other layers of the semiconductor device. In addition, one of ordinary skill in the art will readily recognize that although the formation of only a single trench is discussed, the method and system are capable of forming multiple trenches at substantially the same time.

Figure 3:
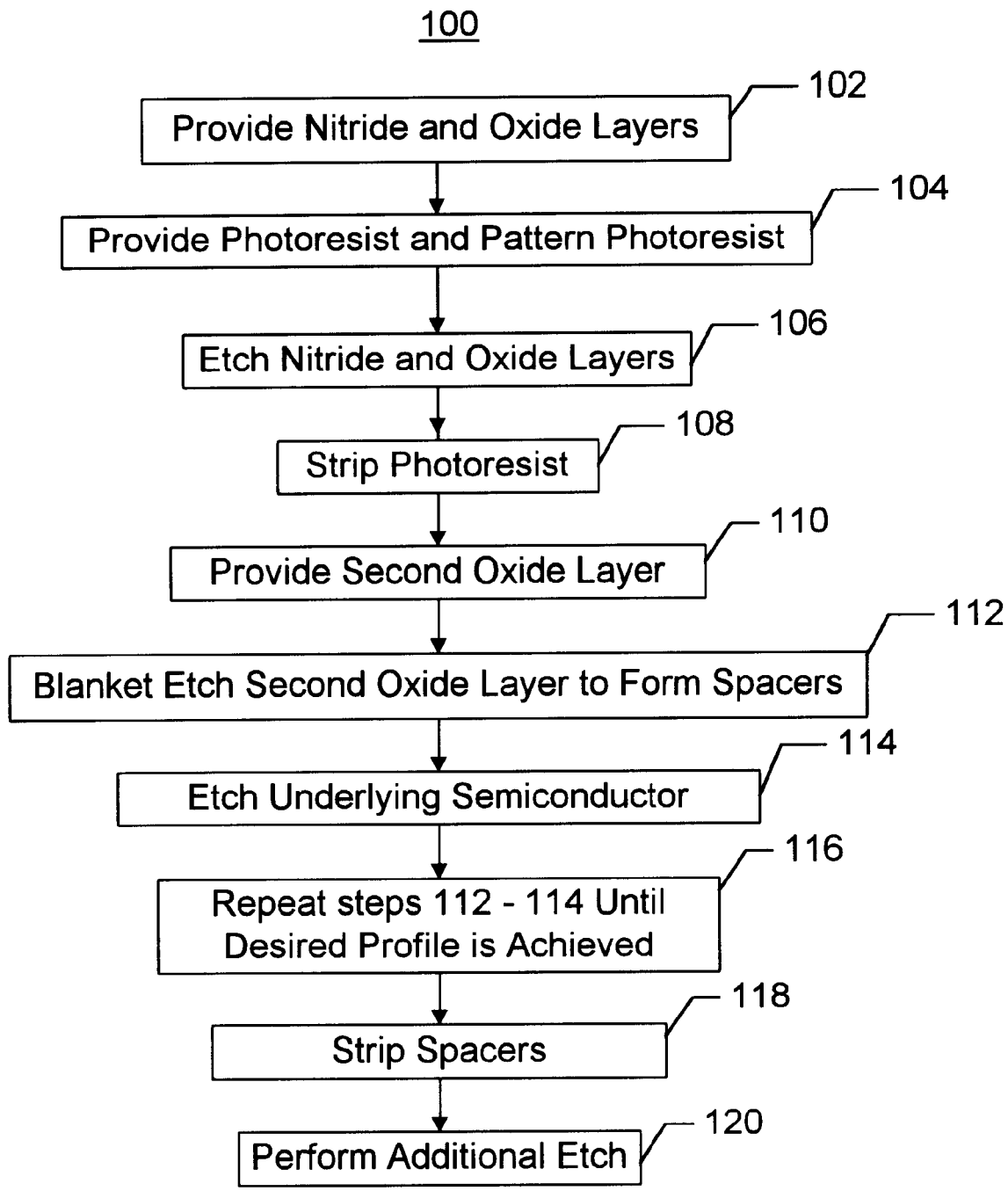
FIG. 3 is a flow chart of a method for providing a trench in accordance with the present invention.

To more particularly illustrate the method and system in accordance with the present invention, refer now to FIG. 3 depicting a flow chart of one embodiment of such a method 100.

The method 100 commences at the step of providing the nitride and oxide layers via step 102. A layer of photoresist is then provided and patterned via step 104. Steps 102 through 104 may be performed in a similar fashion to steps 12 through 18 of the method 10. The patterning of the photoresist exposes the nitride above the regions of the semiconductor in which a trench will be formed. The nitride and oxide layers are then etched via step 106. Thus, a portion of the semiconductor substrate is exposed. The photoresist may then be stripped via step 108.

In order to provide spacers, a second oxide layer is deposited via step 110. Although an oxide is used to form the spacer in a preferred embodiment, any material that will not be etched when the underlying semiconductor is etched can be used to provide the spacers. A blanket etch is then provided via step 112. The blanket etch removes a portion of the second oxide layer. In a preferred embodiment, the blanket etch is anisotropic, removing portions of the second oxide layer which are horizontal, but leaving more vertical portions of the second oxide layer. Thus, spacers are formed.

Figure 4A:
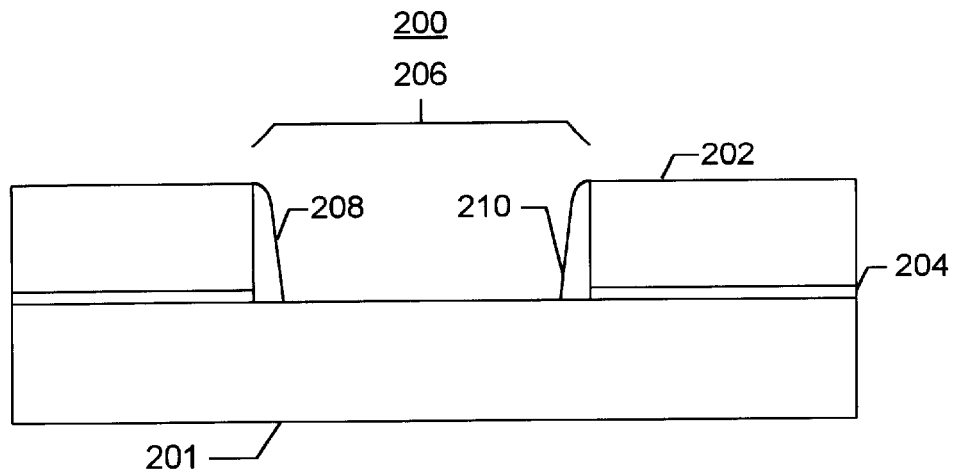
FIG. 4A is a block diagram depicting a system after formation of first spacers in accordance with the present invention.
Figure 4B:
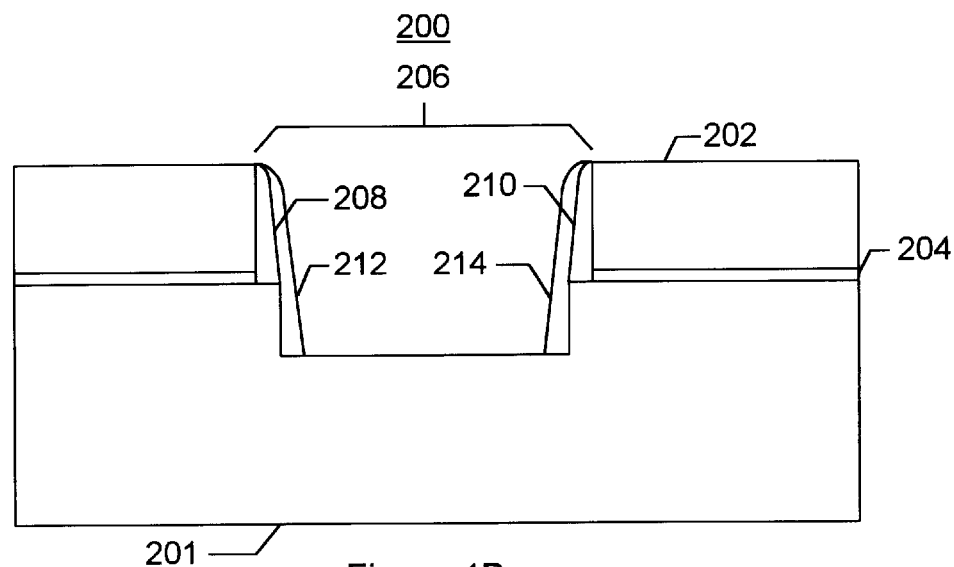
FIG. 4B is a block diagram depicting a system after formation of second spacers in accordance with the present invention.
Figure 4C:
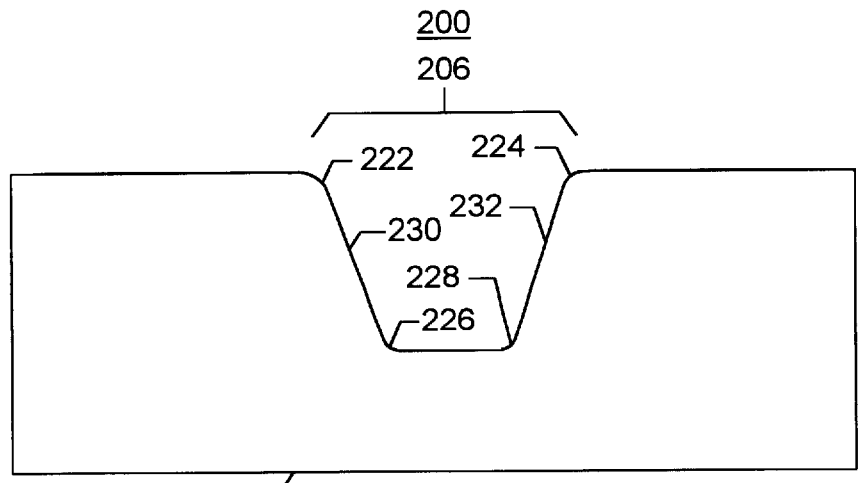
FIG. 4C is a block diagram depicting a trench formed in accordance with the present invention.

FIGS. 4A–4C depict a system 200 after various steps in the method 100 have been performed. FIG. 4A depicts the system 200 after the step 112 has been performed. The system 200 includes a semiconductor substrate 201. A thin oxide layer 204 and a nitride layer 202 are disposed above the surface of the semiconductor 201. The nitride layer 202 and the oxide layer 204 have been etched to expose region 206, in which a trench will be formed. A first set of spacers 208 and 210 are present at the sides of the nitride layer and oxide layer surrounding the region 206 in which the trench will be formed. By adjusting the thickness of the second oxide layer deposited in step 110 and the parameters of the etch provided in step 112, the thickness of the first set of spacers 208 and 210 can be varied. In a preferred embodiment, the thickness of spacers 208 and 210 is on the order of one hundred to one thousand Angstroms. However, the thickness of the spacers 208 and 210 in a particular implementation depend upon the desired trench profile and dimensions. In a preferred embodiment forming a trench of approximately one-fourth micron in width, it is expected that the oxide layer deposited will be on the order of three hundred Angstroms thick and the thickness of the spacers 208 and 210 will be on the order of two hundred Angstroms.

Referring back to FIG. 3, after formation of the spacers 208 and 210, the underlying semiconductor 201 is etched via step 114. The depth to which the semiconductor 201 is etched in this step depends on the final profile desired for the trench.

Steps 110 through 114 are then repeated via step 116 until a desired rough profile for the trench is achieved. FIG. 4B depicts the system 200 after the step 116 has been performed once. In other words, FIG. 4B depicts the system 200 after steps 110 through 114 have been repeated once. The system 200 now includes a second set of spacers 212 and 214. In addition, the spacers 212 and 214 are closer than the spacers 208 and 210. The width of the spacers 212 and 214 can be adjusted by adjusting the thickness of the oxide layer and the parameters of the etch used to form the spacers 212 and 214. In a preferred embodiment, the thickness of spacers 212 and 214 is on the order of one hundred to one thousand Angstroms. However, the thickness of the spacers 212 and 214 in a particular implementation depend upon the desired trench profile and dimensions. In a preferred embodiment forming a trench of approximately one-fourth micron in width, it is expected that the oxide layer deposited to form spacers 212 and 214 will be on the order of three hundred Angstroms thick and the thickness of the spacers 212 and 214 will be on the order of two hundred Angstroms.

After step 116 has been completed, spacers are stripped via step 118. As can be seen in FIG. 4B, the rough profile of the semiconductor remaining after the spacers 208, 210, 212, and 214 are stripped may have a zig zag structure.

Referring back to FIG. 3, an additional etch of the underlying semiconductor is performed via step 120 to smooth the rough profile remaining after the spacers 208, 210, 212, and 214 are stripped. Typically, sharper corners typically etch at higher rates. Thus, the additional etch can smooth any zig zag structure, resulting in smooth trench walls and rounded corners. This additional etch can be performed because the nitride layer 202 has not been stripped yet, thereby preventing non-exposed surfaces of the semiconductor 201 from being etched. Thus, the etch should round corners and smooth any zig zag profile resulting from the use of the spacers 208, 210, 212, and 214.

FIG. 4C depicts the system 200 after the additional etch of step 120 has been completed. The trench 206 includes upper corners 222 and 224, bottom corners 226 and 228, and side walls 230 and 232. The upper corners 222 and 224 as well as the lower corners 226 and 228 are significantly more rounded through the use of the method 100. In addition, the side walls 230 and 232 are sloped to a desired incline through the method 100. Thus, the desired profile for the trench 206 has been achieved. Although rounded corners 222, 224, 226, and 228 and sloped side walls 230 and 232 are depicted in FIG. 4C, almost any desired profile can be achieved.

Figure 5:
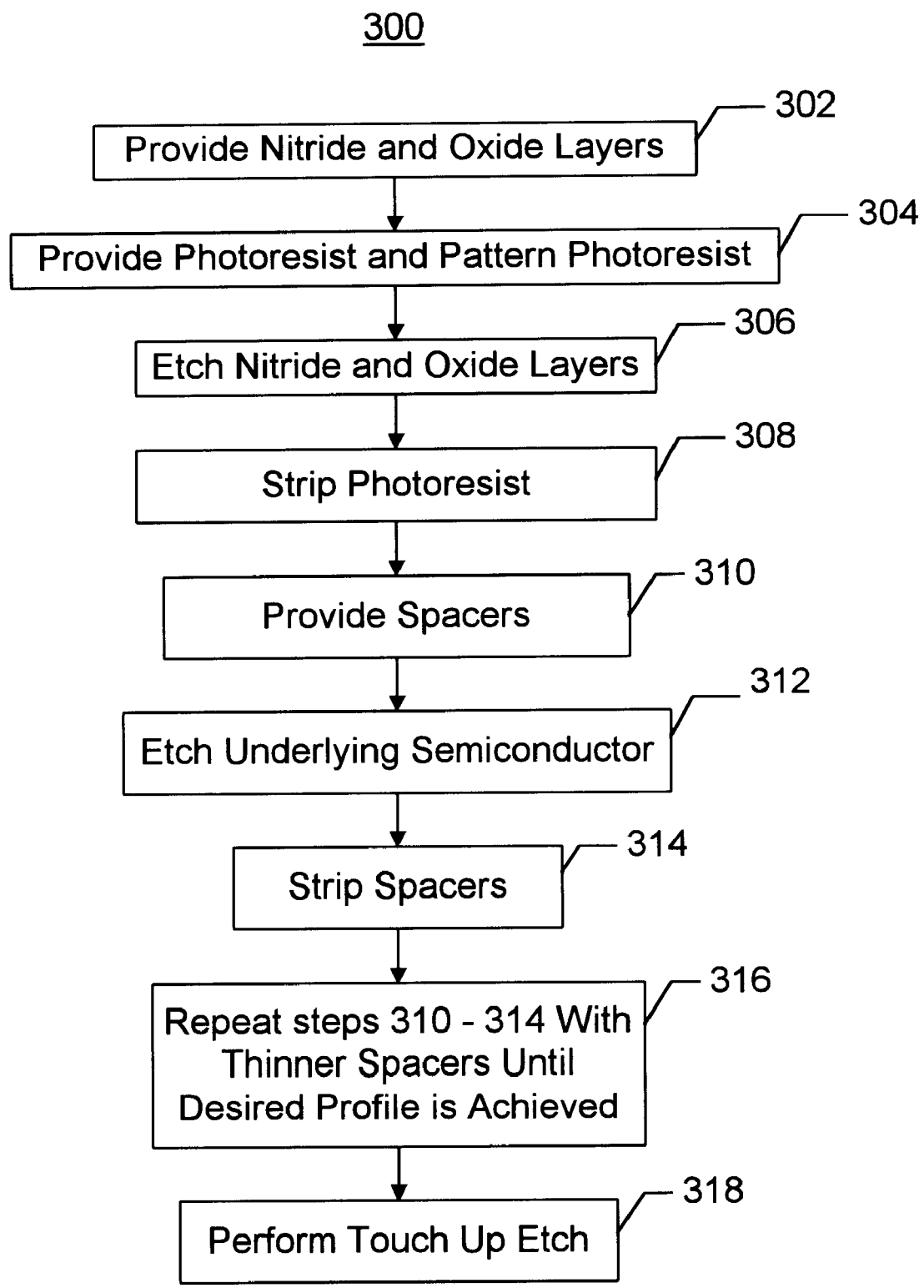
FIG. 5 is a flow chart of another method for providing a trench in accordance with the present invention.

FIG. 5 depicts an alternate method 300 for forming a trench in accordance with the present invention. The method 300 commences at the step of providing the nitride and oxide layers via step 302. A layer of photoresist is then provided and patterned via step 304. Steps 302 through 304 may be performed in a similar fashion to steps 102 through 104 of the method 100. The patterning of the photoresist exposes the nitride above the regions of the semiconductor in which a trench will be formed. The nitride and oxide layers are then etched via step 306. Thus, a portion of the semiconductor substrate is exposed. The photoresist may then be stripped via step 308.

Spacers are then provided via step 310. The step 310 can be performed in a manner similar to the steps 110 through 112 of the method 100. The thickness spacers provided in step 310 is adjusted so that the area that will be the bottom center portion of the trench is exposed. Thus, the spacers provided via step 310 are relatively thick. The underlying semiconductor is then etched via step 312.

After the underlying semiconductor is etched, the spacers are stripped via step 314. The steps 310 through 314 are then repeated using progressively thinner spacers until the desired rough profile is achieved. A touch up etch of the underlying semiconductor is then provided via step 318. Because the spacers are stripped after each etch of the underlying semiconductor, the rough profile of the trench provided using the method 300 should be smoother than the rough profile of the trench provided using the method 100. In other words, because the semiconductor is etched when progressively thinner spacers are in place, the zig zag structure introduced by the presence of the spacers is less pronounced. In addition, corners are more rounded. Thus, the touch up etch provided via step 318 of the method 300 typically erodes less material than the etch provided in the step 120 of the method 100.

A method and system has been disclosed for more accurately tailoring the profile of a trench formed using semiconductor processing. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a trench in a material using semiconductor processing comprising the steps of:
    (a) providing a spacer, the spacer being insensitive to an etch of the material the material being exposed adjacent to the spacer;
    (b) etching the material to form at least a portion of the trench, the spacer preventing a portion of the material under the spacer from being etched during the etching step;
    (c) repeating steps (a) and (b) a sufficient number of times to achieve a profile for the trench.

2. The method of claim 1 wherein the spacer providing step (a) further includes the steps of:
    (a1) depositing a layer of spacer material, the spacer material being insensitive to an etch of the material; and
    (a2) etching the spacer material to provide the first and second spacers.

3. The method of claim 2 wherein the spacer material includes an oxide.

4. The method of claim 3 wherein the material is a semiconductor.

5. The method of claim 4 further comprising the steps of:
    (d) stripping a remaining spacer; and
    (e) providing an additional etch of the material to smooth exposed corners.

6. A method for providing a trench in a material using semiconductor processing comprising the steps of:
    (a) providing a spacer, the spacer being insensitive to an etch of the material the material being exposed adjacent to the spacer;
    (b) etching the material to form at least a portion of the trench, the spacer preventing a portion of the material under the spacer from being etched during the etching step;
    (c) stripping the spacer after the etch; and
    (d) repeating steps (a) through (c) a sufficient number of times to achieve a profile for the trench;
        wherein each time steps (a) and (b) are repeated, a new spacer is thinner than the spacer provided previously.

7. The method of claim 6 wherein the spacer providing step (a) further includes the steps of:
    (a1) depositing a layer of spacer material, the spacer material being insensitive to an etch of the material; and
    (a2) etching the spacer material to provide the first and second spacers.

8. The method of claim 7 wherein the spacer material includes an oxide.

9. The method of claim 7 wherein the material is a semiconductor.

* * * * *